United States Patent
Tajima et al.

(10) Patent No.: US 6,604,266 B1
(45) Date of Patent: Aug. 12, 2003

(54) MANUFACTURING METHOD FOR A PIEZOELECTRIC COMPONENT

(75) Inventors: Seiichi Tajima, Urawa (JP); Takahito Kiriyama, Tokyo (JP)

(73) Assignee: TDK Corporation, Tokyo (JP)

( * ) Notice: Subject to any disclaimer, the term of this patent is extended or adjusted under 35 U.S.C. 154(b) by 176 days.

(21) Appl. No.: 09/604,262

(22) Filed: Jun. 27, 2000

Related U.S. Application Data

(62) Division of application No. 09/103,554, filed on Jun. 24, 1998, now Pat. No. 6,114,795.

(30) Foreign Application Priority Data

Jun. 24, 1997 (JP) ............................... 9-167790
Jun. 24, 1997 (JP) ............................... 9-167791

(51) Int. Cl.[7] .............................................. H04R 17/00
(52) U.S. Cl. ........................ 29/25.35; 29/592.1; 29/593; 156/272.2; 156/275.3; 156/643; 156/646; 219/121.67; 219/121.7; 219/121.71; 219/121.72; 310/312; 310/320; 310/364; 310/365; 310/366
(58) Field of Search ...................... 29/25.35, 592.1, 29/593; 310/312, 320, 365, 364, 366; 156/272.2, 275.3, 643, 646; 219/121.67, 121.7, 121.71, 121.72

(56) References Cited

U.S. PATENT DOCUMENTS

| | | | |
|---|---|---|---|
| 4,107,349 A | * 8/1978 | Vig ............................. 427/36 |
| 4,112,360 A | * 9/1978 | Bergmann ..................... 324/80 |
| 4,131,484 A | 12/1978 | Caruso et al. ................. 134/1 |
| 4,166,145 A | * 8/1979 | Hatch et al. ................. 428/283 |
| 4,316,930 A | * 2/1982 | Stengle, Jr. ................. 428/266 |
| 4,377,765 A | 3/1983 | Kogure et al. ............... 310/312 |
| 4,442,574 A | * 4/1984 | Wanuga et al. ............. 29/25.35 |
| 4,447,753 A | 5/1984 | Ochiai ........................ 310/312 |
| 4,468,582 A | 8/1984 | Fujiwara et al. ............ 310/312 |
| 4,498,025 A | 2/1985 | Takahashi ................... 310/312 |
| 4,562,370 A | 12/1985 | Von Dach ................... 310/312 |
| 4,638,205 A | 1/1987 | Fujita et al. ................. 310/312 |
| 4,642,505 A | 2/1987 | Arvanitis .................... 310/312 |
| 4,666,822 A | 5/1987 | Sinha .......................... 430/311 |
| 4,757,581 A | * 7/1988 | Yamada et al. ............. 29/25.35 |
| 4,771,202 A | 9/1988 | Takahashi ................... 310/312 |
| 4,820,897 A | * 4/1989 | Lefevre .................. 219/121.67 |
| 4,839,618 A | * 6/1989 | Roberts et al. ............. 333/191 |
| 4,897,541 A | * 1/1990 | Phillips ................. 250/227.21 |
| 4,933,588 A | * 6/1990 | Greer ...................... 310/313 D |
| 5,447,767 A | * 9/1995 | Tanabe et al. ............. 428/64.4 |
| 5,623,174 A | * 4/1997 | Markovitz et al. ........... 310/45 |
| 5,632,083 A | * 5/1997 | Tada et al. .................. 29/827 |
| 5,635,642 A | * 6/1997 | Nonomura et al. ...... 73/504.16 |
| 5,762,501 A | * 6/1998 | Levy .......................... 433/215 |
| 5,808,641 A | * 9/1998 | Miyagawa et al. ........... 347/65 |
| 5,854,870 A | * 12/1998 | Helmfrid et al. ............ 385/122 |
| 5,918,354 A | 7/1999 | Ikegami et al. ............ 29/25.35 |
| 5,923,231 A | * 7/1999 | Ohkubo et al. ............. 333/193 |
| 5,966,593 A | * 10/1999 | Budnaitis et al. ........... 438/118 |
| 6,156,482 A | * 12/2000 | Hamada et al. ......... 430/270.21 |

FOREIGN PATENT DOCUMENTS

| JP | 5491092 A | * 7/1979 |
|---|---|---|
| JP | 56-160121 | 12/1981 |
| JP | 5762611 A | * 4/1982 |
| JP | 8097673 A | * 4/1996 |

* cited by examiner

Primary Examiner—A. Dexter Tugbang
Assistant Examiner—Paul Kim
(74) Attorney, Agent, or Firm—Oblon, Spivak, McClelland, Maier & Neustadt, P.C.

(57) ABSTRACT

A method for manufacturing a piezoelectric component in which a resonating portion on a piezoelectric substrate is provided with a deposit that is sensitive to radiation in a range of wavelengths from 350 to 2000 nm so as to have portions thereof trimmed away to form indentations therein without burning the deposit to avoid generating heat that is injurious to the piezoelectric component and substrate. A laser beam in the frequency range of 350 to 2000 nm is then caused to impinge on the deposit to cause the formation of trimmed indentations without substrate damaging heat in a controlled manner to adjust the resonance frequency of the piezoelectric component.

5 Claims, 14 Drawing Sheets

MANUFACTURING METHOD FOR A PIEZOELECTRIC COMPONENT

This application is a division of application Ser. No. 09/103,554, filed Jun. 24, 1998 now U.S. Pat. No. 6,114,795.

BACKGROUND OFF THE INVENTION

1. Field of the Invention

The present invention relates to a piezoelectric component and a method for manufacturing the piezoelectric component.

2. Discussion of Background

Piezoelectric components have been widely employed in various types of electronic devices such as filters, resonators or oscillators in the prior art. A basic requirement that must be fulfilled by a piezoelectric component is that, since desired characteristics are achieved by utilizing the resonance characteristics, the degree of accuracy of its resonance frequency be high.

The following three methods are well known as means for achieving desired resonance characteristics by adjusting the resonance frequency of a piezoelectric component. In the first method, the thickness of the piezoelectric substrate is adjusted through polishing. In the second method, the thickness of the electrode is adjusted and in the third method, the desired resonance characteristics are achieved through the adjustment of the quantity of resin deposited onto the resonating part.

However, the first method poses problems in that it is difficult to perform polishing at the accuracy required for adjusting the resonance frequency and in that inconsistency occurs in the resonance frequency. The second method requires a great length of time and a great deal of work and, furthermore, it does not achieve good reproducibility. The third method presents a problem in that it is difficult to finely adjust the quantity of resin to be deposited onto the resonating part.

An improvement on the third method is disclosed in, for instance, Japanese Unexamined Patent Publication No. 160121/1981. This publication discloses a method whereby the resonance frequency of a piezoelectric substrate to which a mass substance is added in advance is measured, a correct quantity of the mass substance is removed by radiating a laser beam which is controlled in correspondence to the degree of deviation of the resonance frequency relative to the frequency setting on the mass substance added to the piezoelectric substrate to adjust the resonance frequency to the frequency setting.

However, the publication does not refer to specifically how the mass substance should be processed or what type of laser beam should be employed. Consequently, the method disclosed in the publication above is not sufficient to provide a piezoelectric component with a high degree of accuracy in the resonance frequency and a high Q value for its resonance characteristics.

SUMMARY OF THE INVENTION

It is an object of the present invention to provide a piezoelectric component having a resonance frequency which is adjusted with a high degree of accuracy.

It is a further object of the present invention to provide a piezoelectric component with a high degree of accuracy in its resonance frequency and a high Q value for its resonance characteristics.

It is a still further object of the present invention to provide a method for manufacturing piezoelectric components in large quantities that are free of inconsistency in their characteristics through simple processes.

In order to achieve the objects described above, the piezoelectric component according to the present invention includes a piezoelectric substrate and a deposit. The piezoelectric substrate is provided with at least one resonating part. The deposit is added onto a surface of the resonating part and is provided with a plurality of indented portions within a surface enclosed by outer edges.

Since the deposit is added onto the surface of the resonating part, as described above, a load corresponding to the mass of the deposit is applied to the resonating part to set the resonance frequency of the resonating part at a value that corresponds to the mass of the deposit and the load.

Since the deposit is provided with a plurality of indented portions within its surface enclosed by the outer edges, the resonance frequency is set at a value with a high degree of accuracy that corresponds to the number of indented portions, the volume of the indented portions, the distance between the individual indented portions, the pattern of the indented portions and the like.

The indented portions are formed so that the load applied by the deposit to the resonating part is evenly distributed at the surface of the resonating part. Evenly distributing the load in this manner contributes to achieving a higher accuracy in the resonance frequency.

In the method for manufacturing a piezoelectric component according to the present invention, during the step for adjusting the resonance frequency of the piezoelectric component, a laser beam whose wavelength is within a range of 350 to 2000 nm is radiated onto a surface of the deposit and the deposit is trimmed through being irradiated by the laser beam to form indented portions. Thus, the mass of the deposit is reduced in correspondence to the number of indented portions, the size of the indented portions, the distance between the individual indented portions, the pattern of the indented portions and the like to adjust the load applied by the deposit to the resonating part.

Since the indented portions are formed through radiation of a laser beam, their quantity, size, pattern and the like can be set with a high degree of accuracy. As a result, the resonance frequency can be set at a value with a high degree of accuracy.

For the formation of the indented portions, a laser beam having a wavelength within the range of 350 to 2000 nm is radiated. By using a laser beam having a wavelength within this range, indented portions can be formed at the deposit without resulting in any degradation in the piezoelectric characteristics.

It is desirable that the deposit be constituted of resin. By constituting the deposit of resin, the required indented portions can be formed with ease through radiation of a laser beam. It is particularly desirable to use a resin containing a carbon filler at 0.1 to 20 wt %. Since the degree to which a laser beam is absorbed by resin can be adjusted in correspondence to the carbon filler content, the intensity of the required laser beam can be indirectly adjusted by using a resin containing a carbon filler at 0.1 to 20 wt %.

A suitable laser to be employed is a solid-state YAG laser. In particular, the fundamental harmonic (wavelength; 1.06 μm), the second harmonic (wavelength; 530 nm) or the third harmonic (wavelength; 353 nm) of a solid-state YAG laser is ideal.

Furthermore, the present invention discloses a technology for adjusting the resonance frequency without lowering the Q value of a piezoelectric component with an even higher degree of accuracy. This technology may be adopted in an ideal manner when adjusting the resonance characteristics of an oscillator, a resonator or the like that requires highly accurate adjustment of the resonance characteristics.

In the piezoelectric component according to the present invention, the surface of the deposit is scored with indentations and projections, and when the surface roughness of the indented and projected surface is assigned Rmax and the resonance wavelength of the resonating part is assigned $\lambda_0$, a relationship expressed as $Rmax/\lambda_0 \leq 0.008$ is satisfied.

With the surface of the deposit constituted of indentations and projections, the mass of the deposit can be finely controlled in correspondence to the state of the indentations and projections at the surface of the deposit to achieve fine and highly accurate adjustment of the resonance frequency.

The Q value of the resonance characteristics is greatly affected by the state of the indentations and projections at the surface of the deposit. When standardized surface roughness $R_0$ is defined as $(Rmax/\lambda_0)$ with Rmax being the surface roughness of the indented and projected surface and ;Lo being the resonance wavelength of the piezoelectric component, in the range over which the standardized surface roughness $R_0$ is at 0.008 or less, an almost constant high Q value can be achieved regardless of any fluctuation in the standardized surface roughness $R_0$. In the range over which the standardized surface roughness $R_0$ is at 0.008 or more, the Q value is reduced almost exponentially as the standardized surface roughness $R_0$ increases.

In order to obtain a piezoelectric component with the surface of its deposit constituted of indentations and projections, a laser beam having a wavelength of 350 nm or less is irradiated on the deposit to trim the surface of the deposit.

With a laser beam having a wavelength of 350 nm or less, the surface of the deposit can be trimmed evenly to achieve a standardized surface roughness $R_0$ of 0.005 or less, which makes it possible to achieve high accuracy in the resonance frequency and a high Q value. It has been confirmed that when trimming is performed using a laser beam having a wavelength longer than 350 nm, e.g., a laser beam having a wavelength of 353 nm, the Q value becomes lower.

It is desirable to measure the resonance frequency of the piezoelectric component and radiate a laser beam controlled in correspondence to the degree of deviation of the measured resonance frequency relative to the target resonance frequency on the deposit during the trimming process. Through this adjustment method, the resonance frequency can be adjusted to the target resonance frequency with ease.

By repeating the adjustment described above, the accuracy of the resonance frequency adjustment can be improved. During this process, if the wavelength of the laser beam radiated on the deposit is 350 nm or less, only an extremely small quantity of the laser beam is converted to heat. Thus, even immediately after radiation of the laser beam, the resonance frequency of the piezoelectric component can be measured. Consequently, the trimming adjustment process employing the laser beam can be repeated without allowing intervals.

The laser beam employed for the trimming may be set in either the single-mode or the multi-mode. Since the intensity of the laser beam is distributed evenly within the spot when set in multi-mode, trimming can be performed more consistently through radiation of laser beam in the multi-mode to achieve a piezoelectric component with a high degree of accuracy in its resonance frequency and a high Q value for its resonance characteristics.

Alternatively, trimming may be achieved by scanning the laser beam spot over the entire surface of the deposit evenly. In this case, the quantity of shift in the resonance frequency per scan is constant. As a result, by selecting the number of scans to be performed with the laser beam spot, the resonance frequency can be adjusted.

In addition, to irradiate the deposit, a pulse oscillation type laser system may be employed to radiate a pulse laser beam over the entire surface of the deposit evenly.

As described above, the quantity of shift in the resonance frequency per laser beam irradiation is constant. Consequently, the resonance frequency can be adjusted in correspondence to the number of times that the pulse laser beam is radiated.

BRIEF DESCRIPTION OF THE DRAWINGS

These and other advantages, features and objects of the present invention will be understood by those of ordinary skill in the art referring to the annexed drawings, given purely by way of non-limitative example, in which.

DETAILED DESCRIPTION OF THE PREFERRED EMBODIMENTS

Figure 1:
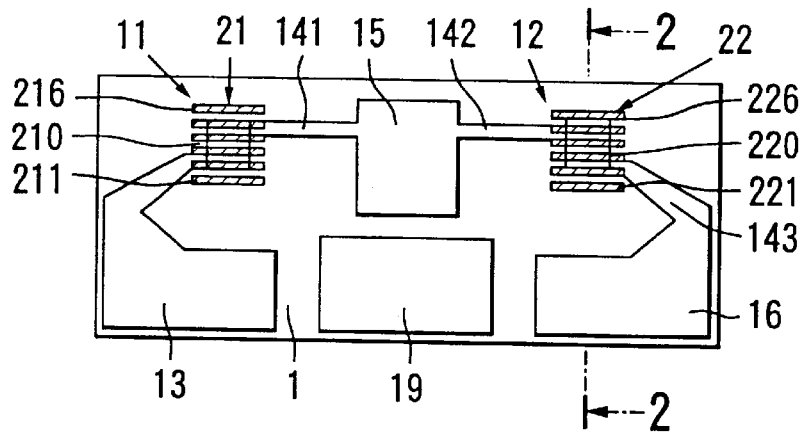
FIG. 1 is a plan view of the piezoelectric component according to the present invention.
Figure 2:
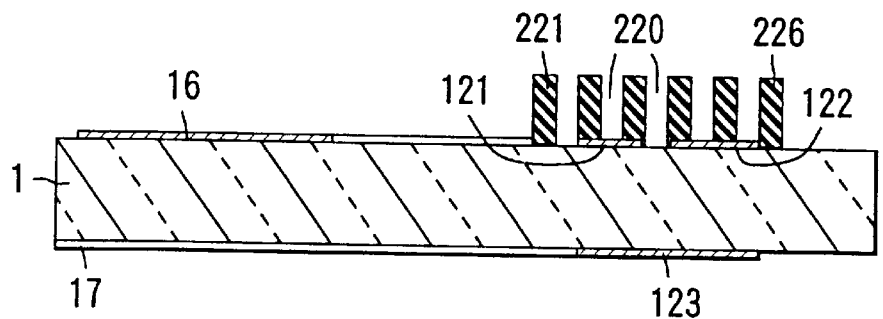
FIG. 2 is an enlarged sectional view of the piezoelectric component taken along line 2—2 in FIG. 1.

FIGS. 1 and 2 illustrate an example of a ceramic filter. It is to be noted, however, that the component may be an oscillator, a resonator or the like instead. The piezoelectric component in the figures includes a piezoelectric substrate 1 constituted of ceramic and deposits 21 and 22. The piezoelectric substrate 1 is provided with two resonating parts 11 and 12. The deposit 21, which is added onto a surface of the resonating part 11, is provided with a plurality of indented portions 210 in its surface enclosed by outer edges. The indented portions 210 are formed as grooves. The deposit 21 is divided into a plurality of divided portions 211 to 216 by the groove-like indented portions 210.

The deposit 22, which is added onto a surface of the resonating part 12, is also provided with a plurality of indented portions 220 in its surface enclosed by outer edges. The indented portions 220 are formed as grooves. The deposit 22 is divided into a plurality of divided portions 221 to 226 by the groove-like indented portions 220.

The height of the divided portions 211 to 216 and 221 to 226 should be set at approximately 10 to 20 µm. The width of the groove-like indented portions 210 and 220 may be set at, for instance, approximately 30 µm. The shapes of the indented portions 210 and 220 and the divided portions 211 to 216 and 221 to 226 are not limited to the linear shape illustrated in the figures, and they may take any arbitrary pattern including curves, diagonal lines, broken lines and the like. The indented portions 210 and 220 may be constituted of holes passing through the deposits 21 and 22 respectively or they may be constituted of non-through holes whose depth is smaller than the thickness of the deposits 21 and 22.

As described above, since the deposits 21 and 22 are added onto the surfaces of the resonating parts 11 and 12 respectively, loads that correspond to the masses of the deposits 21 and 22 are applied to the resonating parts 11 and 12 to set the resonance frequencies of the resonating parts 11 and 12 to values corresponding to the masses of the deposits 21 and 22.

Since the deposit 21 on the resonating part 11 is provided with a plurality of indented portions 210 in its surface enclosed by the outer edges, the resonance frequency is set to a high accuracy value corresponding to the number of indented portions 210, the size of the indented portions 210, the distance between the individual indented portions, the pattern of the indented portions 210 and the like. In the embodiment, since the deposit 21 is divided into a plurality of divided portions 211 to 216 by the plurality of indented portions 210, the resonance frequency of the resonating part 11 is set to a high accuracy value that corresponds to the number of the divided portions 211 to 216, the number of the indented portions 210 between the individual divided portions 211 to 216, the masses of the individual divided portions 211 to 216, the pattern of the divided portions 211 to 216 and the like.

Since the deposit 22 on the resonating part 12, too, is divided into a plurality of divided portions 221 to 226, the resonance frequency of the resonating part 12, too, can be set to a high accuracy value corresponding to the number of the divided portions 221 to 226, the number of indented portions 220, the masses of the individual divided portions 221 to 226, the pattern of the divided portions 221 to 226 and the like.

The deposits 21 and 22 are formed so that the patterns achieved by the divided portions 211 to 216 and 221 to 226 divided by the indented portions 210 and 220 respectively form stripes, for instance. By achieving such stripe patterns, loads applied to the resonating parts 11 and 12 by the divided portions 211 to 216 and 221 to 226 can be evenly distributed at the surfaces of the resonating parts 11 and 12. Distributing the loads evenly contributes to achieving a higher degree of accuracy in the resonance frequencies. However, patterns including lattice patterns, island-like patterns and the like, other than stripe patterns, may be adopted.

Figure 3:
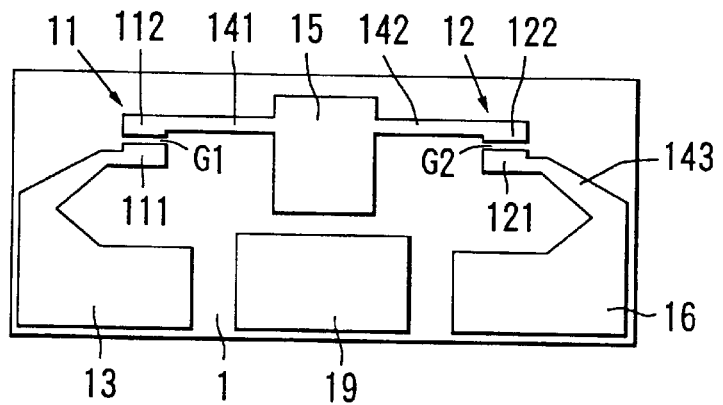
FIG. 3 is a plan view of the piezoelectric component in FIGS. 1 and 2, in a state before the deposits are added.
Figure 4:
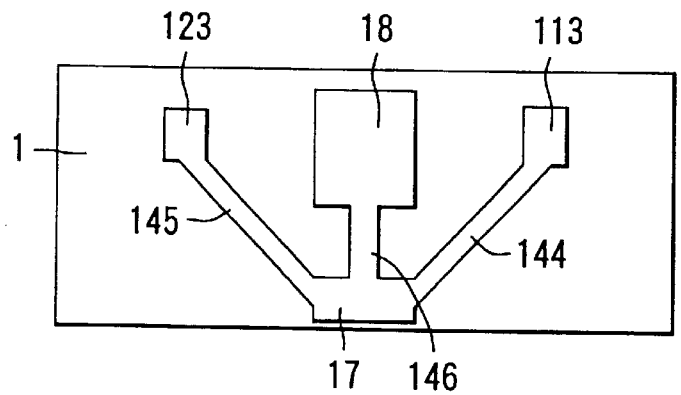
FIG. 4 is a bottom view of the piezoelectric component illustrated in FIG. 3.

FIG. 3 is a plan view of the piezoelectric component shown in FIGS. 1 and 2 before the deposits are added and FIG. 4 is a bottom view of the piezoelectric component illustrated in FIG. 3. The piezoelectric substrate 1 is formed in a plate shape using a piezoelectric ceramic material known in the prior art. The resonating part 11 includes split electrodes 111 and 112 and a common electrode 113. The split electrode 111 and the split electrode 112 are formed at a front surface of the piezoelectric substrate 1 with a gap G1 formed between them. The common electrode 113 is provided at the rear surface of the piezoelectric substrate 1 at a position facing opposite the split electrodes 111 and 112.

The resonating part 12 includes split electrodes 121 and 122 and a common electrode 123. The split electrode 121 and the split electrode 122 are formed at the front surface of the piezoelectric substrate 1 with a gap G2 formed between them. The common electrode 113 is provided at the rear surface of the piezoelectric substrate 1 at a position facing opposite the split electrodes 121 and 122.

The split electrode 111 belonging to the resonating part 11 is connected to an input/output terminal electrode 13, whereas the split electrode 112 is connected to the split electrode 122 at the resonating part 12 via a lead electrode 141, a capacitor electrode 15 and a lead electrode 142. The split electrode 121 at the resonating part 12 is connected to an input/output terminal electrode 16 via a lead electrode 143.

The common electrodes 113 and 123 provided at the rear surface of the piezoelectric substrate 1 are connected to a terminal electrode 17 through lead electrodes 144 and 145 respectively. In addition, a capacitor electrode 18 is provided at the rear surface of the piezoelectric substrate 1. This capacitor electrode 18 faces opposite the capacitor electrode 15 provided at the front surface, and is connected to the terminal electrode 17 through a lead electrode 146. The terminal electrode 17 is made to be continuous with a common terminal electrode 19 provided at the front surface by a through hole conductor (not shown) that passes through the piezoelectric substrate 1 in its thicknesswise direction or the like.

Although not shown, the deposits 21 and 22 may be added onto the common electrodes 113 and 123 respectively provided at the rear surface as well as onto the split electrodes (111, 112) and (121, 122) provided at the front surface, or the deposits 21 and 22 may be added onto the common electrodes 113 and 123 only.

The deposits 21 and 22, which are constituted of resin, are adhered onto the resonating parts 11 and 12 by employing a means such as coating. By constituting them of resin, a correct load for resonance frequency adjustment can be achieved and, at the same time, a sufficient degree of adhesion to the piezoelectric substrate 1 is achieved. The resin may contain a carbon filler. A desirable carbon filler content is within the range of 0.1 to 20 wt %. By selecting the content of the carbon filler whose specific gravity is different from that of the resin within the range described above, the masses of the deposits 21 and 22 are adjusted so that the resonance frequencies at the resonating parts 11 and 12 can be finely adjusted accordingly.

Furthermore, when the carbon filler content is within the range of 0.1 to 20 wt %, frequency adjustment through trimming can be implemented in a stable manner. Moreover, it is possible to maintain the specific resistivity of the deposits 21 and 22 at a high value, exceeding $10^{14}$ (ohm·cm) to prevent the deposits 21 and 22 from electrically affecting the electrodes constituting the resonating parts 11 and 12. In the range over which the carbon filler content is less than 0.1 wt % and in the range over which the carbon filler content exceeds 20 wt %, the absorption of the laser beam is unstable and the quantity of the frequency shift relative to the unit trimming quantity fluctuates. Furthermore, when the carbon filler content exceeds 20 wt %, the relative resistivity of the deposits 21 and 22 fall to an extremely low value of less than $10^3$ (ohm·cm), and consequently, the electrical influence of the deposits 21 and 22 on the electrodes constituting the resonating parts 11 and 12 can no longer be disregarded. The deposits 21 and 22 should be constituted of fine particles containing carbon and a filler constituted of Talc 3MgO. $4SiO_2 \cdot H_2O$, or the like.

Figure 5:
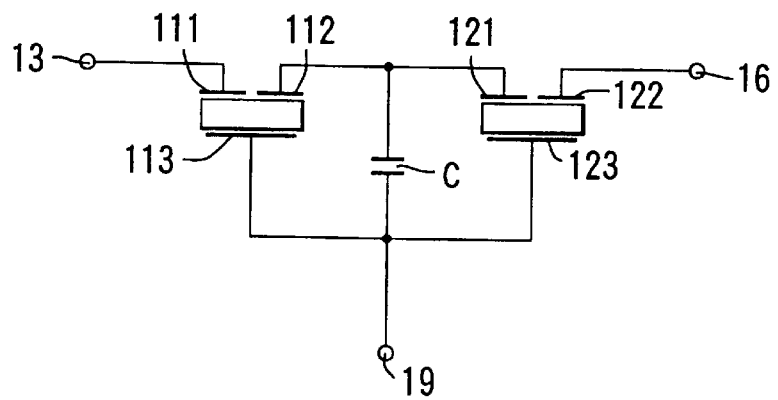
FIG. 5 is an electrical symbol diagram of the piezoelectric component in FIGS. 3 and 4.

FIG. 5 is an electrical symbol diagram of the piezoelectric component illustrated in FIGS. 3 and 4. A circuit structure achieved by connecting in cascade the resonating part 11 constituted of the split electrode 111 and 112 and the common electrode 113 and the resonating part 12 constituted of the split electrodes 121 and 122 and the common electrode 123 and connecting one end of a capacitor C constituted of the capacitor electrode 15 and the capacitor electrode 18 to the connection point of the two resonating parts with another end of the capacitor C connected to the common terminal electrode 19, is assumed. The split electrode 111 at the resonating part 11 is connected to the input/output terminal electrode 13, whereas the split electrode 121 at the resonating part 12 is connected to the input/output terminal 16.

Figure 6:
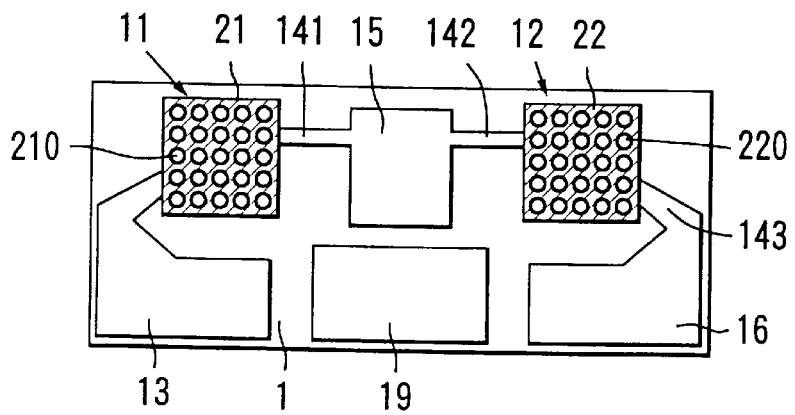
FIG. 6 a plan view illustrating another embodiment of the piezoelectric component according to the present invention.

FIG. 6 is a plan view illustrating another embodiment of the piezoelectric component according to the present invention. In the figure, the same reference numbers are assigned to components that are identical to those in FIGS. 1 to 5. This embodiment is characterized in that indented portions 210 and 220 constituted of through holes or non-through holes are provided at the deposits 21 and 22. Similar advantages to those achieved in the previous embodiment are also realized through this embodiment.

Next, a step for implementing the resonance frequency adjustment which is included in the method for manufacturing a piezoelectric component according to the present invention, is explained. As a specific example, center frequency adjustment performed on a ceramic filter with a selected center frequency at 10.7 MHz is explained.

Figure 7:
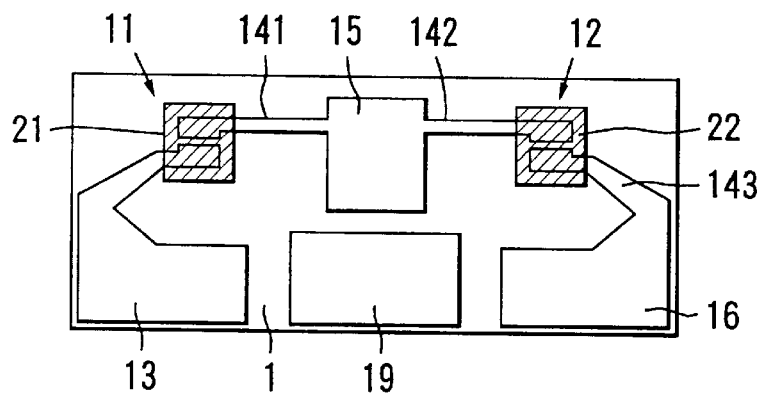
FIG. 7 is a plan view of a piezoelectric component for which center frequency adjustment is performed.

FIG. 7 is a plan view of the piezoelectric component upon which the frequency adjustment is performed. In the figure, the same reference numbers are assigned to components that are identical to those in FIGS. 1 to 6. As illustrated in FIG. 7, the deposits 21 and 22 are adhered onto the front surfaces of the resonating parts 11 and 12. The deposits 21 and 22 are constituted of resin. The required indented portions 210 and 220 can be formed with ease through laser beam irradiation of the deposits 21 and 22 constituted of resin. The deposits 21 and 22 are constituted of a resin containing a carbon filler. The desirable carbon filler content is 0.1 to 20 wt %.

The deposits 21 and 22 are formed in a square shape with the length of each side at 1.1 mm over a thickness of 10 μm. However, it goes without saying that they may be formed in a shape other than a square shape, such as a circular shape, another polygonal shape or the like.

Figure 8:
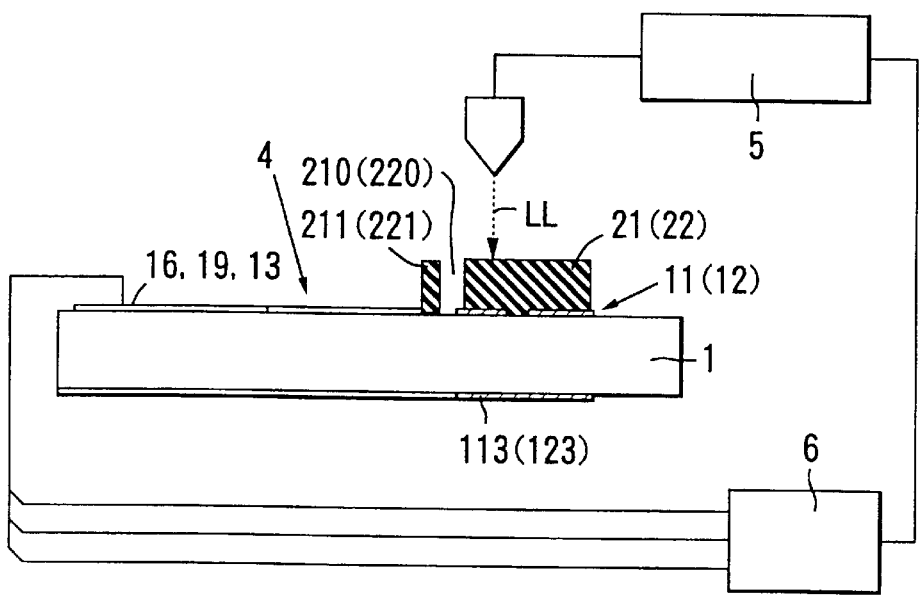
FIG. 8 illustrates a method for center frequency adjustment performed on the piezoelectric component shown in FIG. 7.

FIG. 8 illustrates the method for frequency adjustment that may be implemented with the piezoelectric component shown in FIG. 7. In the figure, a laser beam LL having a wavelength within the range of 350 to 2000 nm is radiated on the surfaces of the deposits 21 and 22 adhered onto the resonating parts 11 and 12 of the piezoelectric component 4 and through the irradiation of the laser beam LL, the deposits 21 and 22 are trimmed to form the groove-like indented portions and 220. Through this process, the divided portions 211 and 221 are obtained, and the masses of the deposits 21 and 22 are reduced so that the loads applied to the resonating parts 11 and 12 by the deposits 21 and 22 are adjusted. By repeating this process of indented portion formation, the required number of indented portions 210 and 220 are formed to adjust the center frequency to a target value. The center frequency is adjusted to a value which is determined in accordance to the number of the indented portions 210 and 220, and the number, size or pattern of the divided portions.

As explained earlier, the deposits 21 and 22 are constituted of a resin which, preferably, contains a carbon filler at 0.1 to 20 wt %. Table I presents the relationship between the carbon filler content (the quantity at which it is added), and the coefficient of variation (%), the specific resistivity (ohm·cm) and the printability.

TABLE I

| carbon filler content (wt %) | coefficient of variation after trimming (%) | deposit specific resistivity (Ω.cm) | printability |
|---|---|---|---|
| 0.01 | 0.05~0.15 | >$10^{14}$ | good |
| 0.05 | 0.05~0.10 | >$10^{14}$ | good |
| 0.1 | <0.03 | >$10^{14}$ | good |
| 0.5 | <0.03 | >$10^{14}$ | good |
| 1 | <0.03 | >$10^{14}$ | good |
| 5 | <0.03 | >$10^{14}$ | good |
| 10 | <0.03 | >$10^{14}$ | good |

TABLE I-continued

| carbon filler content (wt %) | coefficient of variation after trimming (%) | deposit specific resistivity (Ω·cm) | print-ability |
|---|---|---|---|
| 15 | <0.03 | >10$^{14}$ | good |
| 18 | <0.03 | >10$^{14}$ | good |
| 20 | <0.03 | >10$^{14}$ | good |
| 22 | impossible to measure | <10$^3$ | good |
| 25 | impossible to measure | <10$^3$ | good |

As indicated in Table I, when the carbon filler content is within the range of 0.1 to 20 wt %, the coefficient of variation after trimming is stabilized at a low value of less than 0.03%. Furthermore, in this range, the specific resistivity of the deposits 22 achieves a high value that exceeds 10$^{14}$ (ohm·cm). In contrast, in the range over which the carbon filler content is less than 0.1 wt % and in the range over which the carbon filler content is equal to or exceeds 22 wt %, the coefficient of variation rimming changes over a wide range of 0.05 to 0.15%. This is assumed to be the result of unstable absorption of the laser beam. Moreover, when the carbon filler content exceeds 20 wt %, the specific resistivity of the deposits 21 and 22 falls to an extremely low value, under 10$^3$ (ohm·cm).

Since the indented portions 210 and 220 are formed through laser beam irradiation, the number of the indented portions, their size, their pattern and the like can be set with a high degree of accuracy. Thus, the center frequency can be set at a high accuracy value.

The indented portions 210 and 220 are formed by radiating a laser beam having a wavelength within a range of 350 to 2000 nm. By using a laser beam having a wavelength within this range, the indented portions 210 and 220 can be formed at the deposits 21 and 22 without resulting in degradation of the piezoelectric characteristics.

Various types of laser including excimer laser, solid-state laser, gas laser and organic laser may be employed for laser irradiation. An explanation is given on a case in which a solid-state YAG laser beam is employed, in reference to the embodiment. When employing a solid-state YAG laser beam, one of the following, i.e., its fundamental harmonic (wavelength; 1.06 μm), its second harmonic (wavelength; 530 nm) and its third harmonic (wavelength; 353 nm), should be used. The wavelengths of higher harmonics including the fourth harmonic (wavelength; 266 nm) are in the ultraviolet light range and the processability will deteriorate. In addition, if a laser beam having a wavelength exceeding 2000 nm is irradiated, (the resin will be burned by the laser beam and degradation of the piezoelectric characteristics caused by the heat will result.

When machining the indented portions 210 and 220, the center frequency of the piezoelectric component 4 is measured with a measuring device 6 prior to the machining to calculate the difference between the measured center frequency and a target center frequency. Then, the number of required indented portions 210 and 220 is determined through a conversion formula for the number of indented portions 210 and 220 and the quantity of the center frequency shift.

Figure 9:
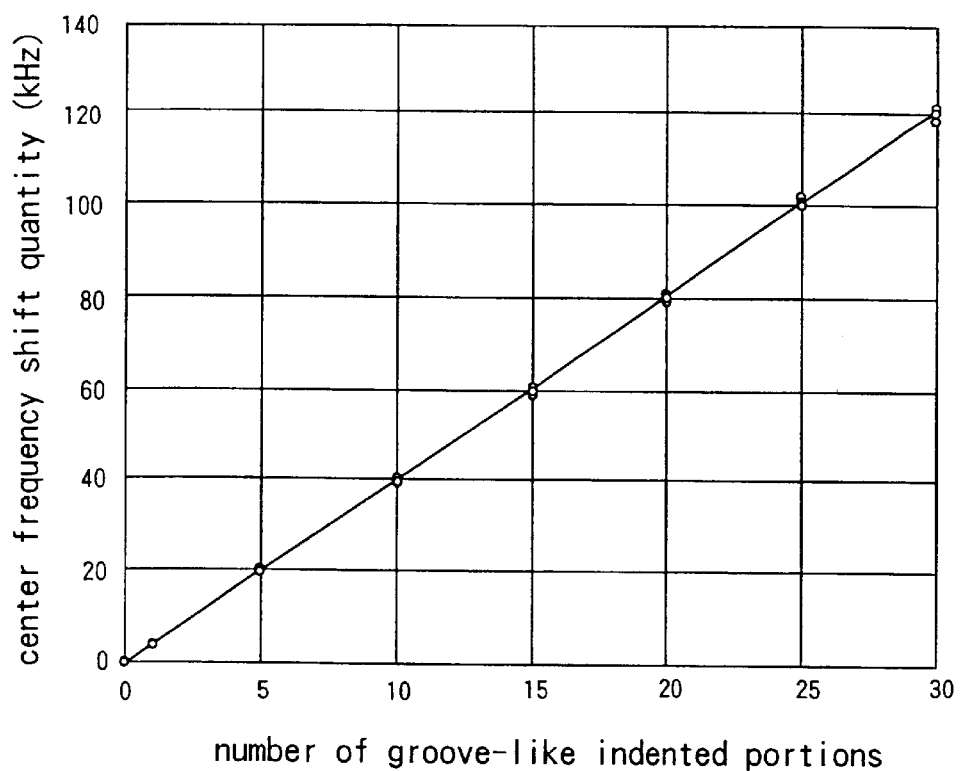
FIG. 9 illustrates the relationship between the number of grooves and the quantity of center frequency shift (kHz)

FIG. 9 illustrates the relationship between the number of indented portions and the center frequency shift quantity (kHz). These data are used when forming indented portions 210 and 220 as grooves with a width of 33 μm and a length of 1 mm, by employing the fundamental harmonic of the solid-state YAG laser. As illustrated in the figure, the center frequency shifts by approximately 4 kHz per groove-like indented portion. This shift is made in the direction in which the center frequency increases, i.e., toward the higher frequency. Thus, the conversion formula for the number of indented portions 210 and 220 and the center frequency shift quantity to be adopted in this embodiment is expressed as:

number of indented portions=(target center frequency −measured center frequency)kHz/4 kHz It is to be noted that, since it is necessary to achieve identical frequency characteristics at the two resonating parts 11 and 12 in the ceramic filter in this embodiment, the same machining must be performed to form identical indented portion at the two resonating parts 11 and 12.

In the embodiment illustrated in FIG. 8, a measuring device 6 for measuring the center frequency of the piezoelectric component 4 is provided, the data in regard to the center frequency obtained at the measuring device 6 are sent to a laser apparatus 5 and the required number of indented portions is calculated at the laser apparatus 5 in correspondence to the degree of deviation of the measured center frequency relative to the target center frequency. Then, the intervals over which the indented portions are to be machined are calculated based upon the dimensions of the deposits 21 and 22, the number of indented portions, the width of the indented portions and the like, and in correspondence to the results of the calculation, the laser beam LL is radiated onto the deposits 21 and 22 to form the indented portions 210 and 220.

Figure 10:
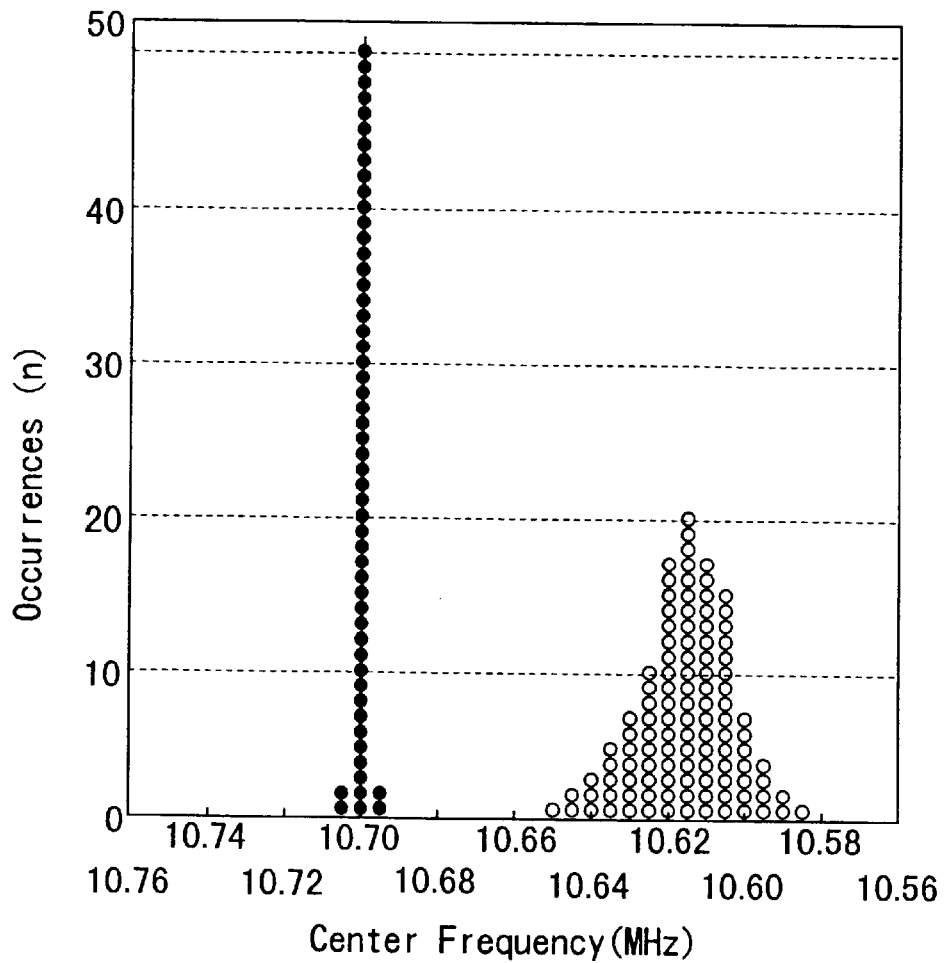
FIG. 10 is a graph illustrating the distribution of center frequencies.

Now, the test example described above and its results are explained. In the test, indented portions were machined at the deposits of the individual elements in an aggregated substrate constituted of a plurality of substrates by using the fundamental harmonic of a solid-state YAG laser. FIG. 10 presents a graph indicating the frequency distribution of the center frequencies. As the figure indicates, while the center frequencies of the piezoelectric components were inconsistent, ranging from 10.58 to 10.66 MHz in the pre-adjustment measurement, almost the entire number n of the piezoelectric components on the aggregated substrate were adjusted to achieve a center frequency of 10.7 MHz through the adjustment.

Figure 11:
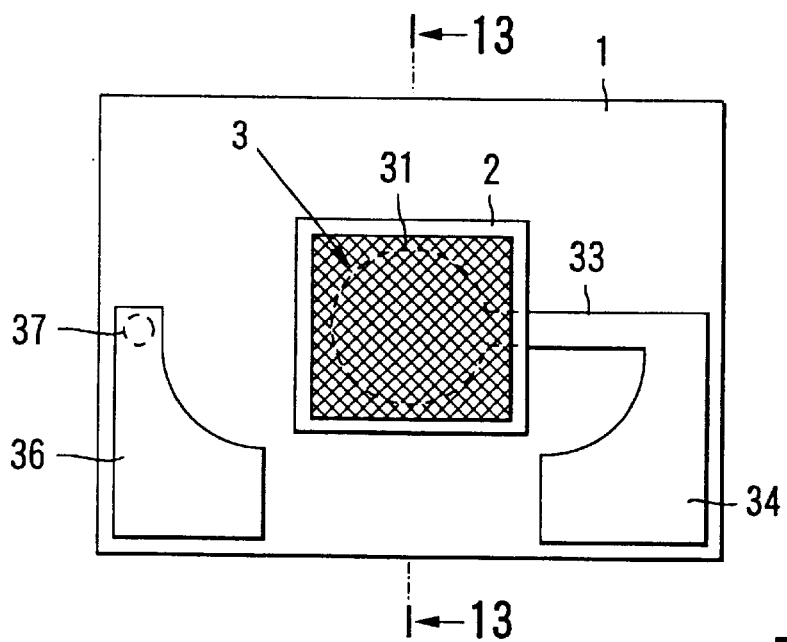
FIG. 11 is a plan view illustrating another embodiment of the piezoelectric component according to the present invention.
Figure 12:
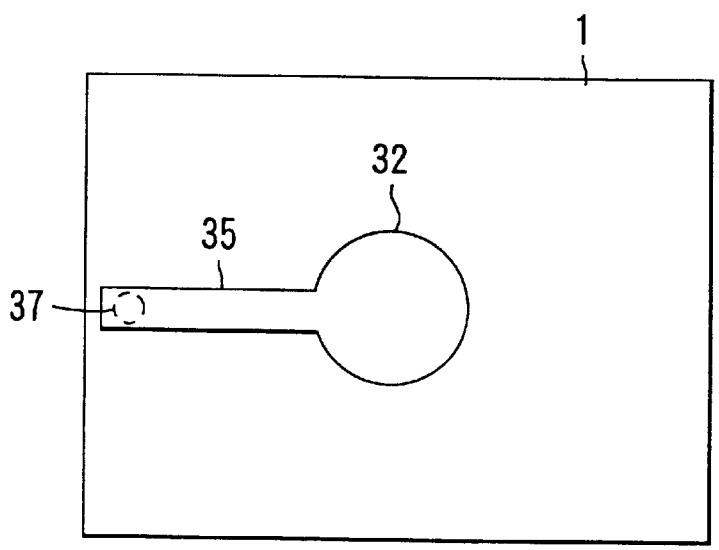
FIG. 12 is a bottom view of the piezoelectric component in FIG. 11.
Figure 13:
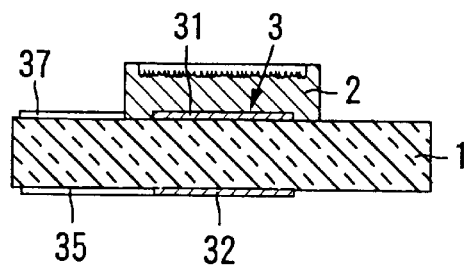
FIG. 13 is a sectional view of the piezoelectric component taken along line 13—13 in FIG. 11.

Next, a means that is suited for adjustment of the resonance characteristics of an oscillator, and a resonator is explained. FIGS. 11 to 13 illustrate an example of a ceramic oscillator. However, the piezoelectric component may be constituted as a filter or the like instead of an oscillator.

As illustrated in the figures, the piezoelectric component according to the present invention includes a piezoelectric substrate 1 and at least one deposit 2. The piezoelectric substrate is formed in a plate shape using a piezoelectric ceramic material in the known art. The piezoelectric substrate is provided with at least one resonating part 3. The resonating part 3 includes a front electrode 31 and a rear electrode 32. The front electrode 31 is provided at the front surface of the piezoelectric substrate 1, whereas the rear electrode 32 is provided at the rear surface of the piezoelectric substrate 1. The front electrode 31 and the rear electrode 32 face opposite each other across the piezoelectric substrate 1. At the front surface of the piezoelectric substrate 1, a front lead electrode 33 and a first terminal electrode 34 are provided. The front electrode 31 is connected to the front lead electrode 33 which, in turn, is connected to the first terminal electrode 34. A rear lead electrode 35 is provided at the rear surface of the piezoelectric substrate 1. A second terminal electrode 36 is provided at the front surface of the piezoelectric substrate 1. The rear electrode 32 is connected to the rear lead electrode 35, and the rear lead electrode 35 and the second terminal electrode 36 are connected with each other via a through hole conductor 37.

The deposit 2 is added onto the resonating part 3. In the embodiment, the deposit 2 is adhered to cover the front electrode 31 constituting the resonating part 3. Although not shown, the deposit 2 may be provided at the rear electrode 32 as well as at the front electrode 31 or the deposit 2 may be provided at the rear electrode 32 only. The deposit 2 is constituted of resin. An ultraviolet light setting resin is particularly suited for this purpose. The resin is adhered by means such as coating to cover the entire surface of the front electrode constituting the resonating part 3.

The surface of the deposit 2 is constituted of indentations and projections, and when the surface roughness of the indented and projected surface is assigned Rmax and the resonance wavelength at the resonating part 3 is assigned $\lambda_0$, the standardized surface roughness $R_0$ defined as $(Rmax/\lambda_0)$ satisfies $0 < R_0 \leq 0.008$.

Figure 14:
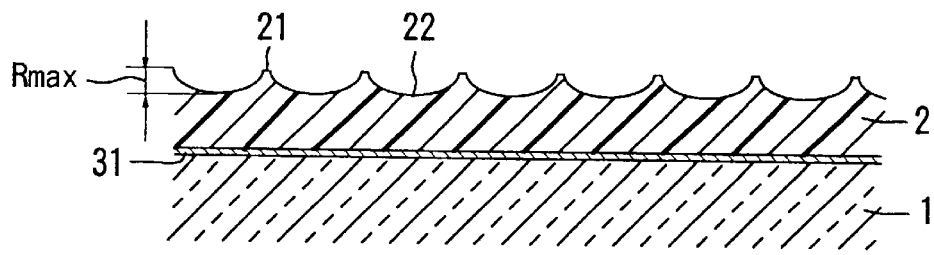
FIG. 14 is a schematic sectional view illustrating the indentations and projections at the surface of the deposit.

FIG. 14 is a sectional view that schematically illustrates the indentations and projections at the surface of the deposit 2. The surface of the deposit 2 is a rough surface having a great number of minute projections 21. The areal density of the projections 21 may be, for instance, approximately 10,000/1 mm². The surface roughness Rmax determined based upon the depth of the valley portions between the projections and the height of the apex of the projections 21 is approximately 1.0 $\mu$m in an example in which the standardized surface roughness $R_0 = 0.008$ and the resonance frequency at the resonating part 3 is 40 MHz. At the indented and projected surface of the deposit 2, it is desirable that the valley portions 22 formed between the projections 21 do not reach the front surface of the piezoelectric substrate 1.

As explained above, since the deposit 2 is added onto the resonating part 3 in the piezoelectric component according to the present invention, the resonance characteristics at the resonating part 3 are adjusted in correspondence to the mass of the deposit 2.

Since the surface of the deposit 2 is constituted as a surface having indentations and projections, the mass of the deposit 2 is finely controlled in correspondence to the state of the indentations and projections at the surface of the deposit 2. Thus, a piezoelectric component having a resonance frequency that is finely controlled with a high degree of accuracy is achieved.

Figure 15:
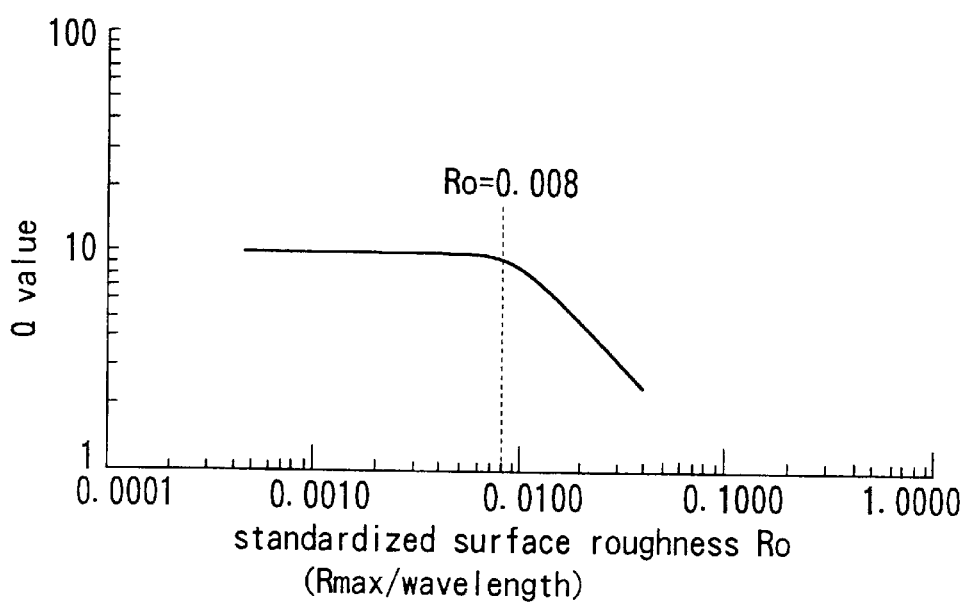
FIG. 15 illustrates the relationship between the standardized surface roughness $R_0$ and the Q value.

The Q value of the resonance characteristics is greatly affected by the state of the indentations and projections at the surface of the deposit 2. FIG. 15 illustrates the relationship between the standardized surface roughness $R_0$ and the Q value. As the figure indicates, in the range over which the standardized surface roughness $R_0$ is equal to or less than 0.008, a high Q value which is almost constant is achieved, regardless of variations in the surface roughness $R_0$.

In the range over which the standardized surface roughness $R_0$ is equal to or greater than 0.008, the Q value becomes lower almost linearly as the standardized surface roughness $R_0$ increases.

Next, a step for implementing the resonance frequency adjustment that is included in the method for manufacturing a piezoelectric component according to the present invention is explained. The explanation is given on an example in which a ceramic oscillator having an oscillation frequency of 40 MHz, which utilities a thicknesswise longitudinal vibration mode is obtained as a specific example of the piezoelectric component, in reference to this embodiment.

Figure 16:
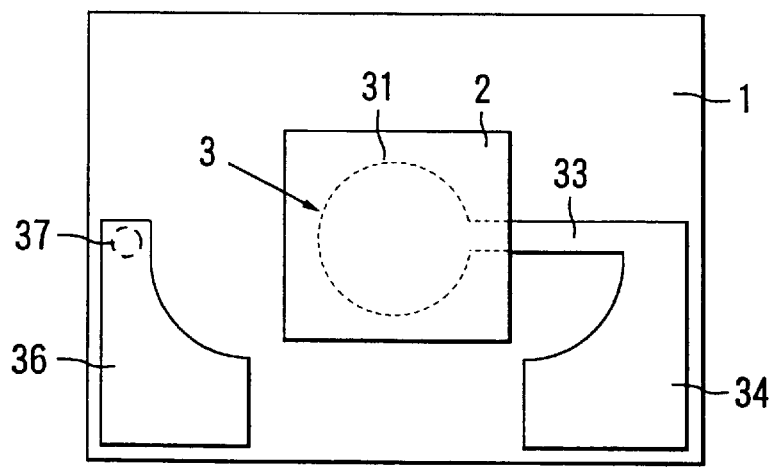
FIG. 16 illustrates a piezoelectric component for which the resonance frequency adjustment is performed.

FIG. 16 is a plan view illustrating another embodiment of the piezoelectric component with which the resonance frequency adjustment is performed. In the figure, the same reference numbers are assigned to components identical to those in FIG. 11. As illustrated in FIG. 16, the deposit 2 is applied onto a front surface of a front electrode 31 which is formed in a circular shape with a diameter of 0.8 mm. An ultraviolet light setting resin is used to constitute the deposit 2 and the ultraviolet light setting resin is coated in a quadrangular shape 15 and then is caused to set through irradiation with ultraviolet light. The deposit 2 was coated in a square shape with the length of each side at 1.1 mm over a thickness of 5 $\mu$m. However, it goes without saying that the deposit 2 may be applied in a circular shape or any other polygonal shape instead of such a square shape.

Figure 17:
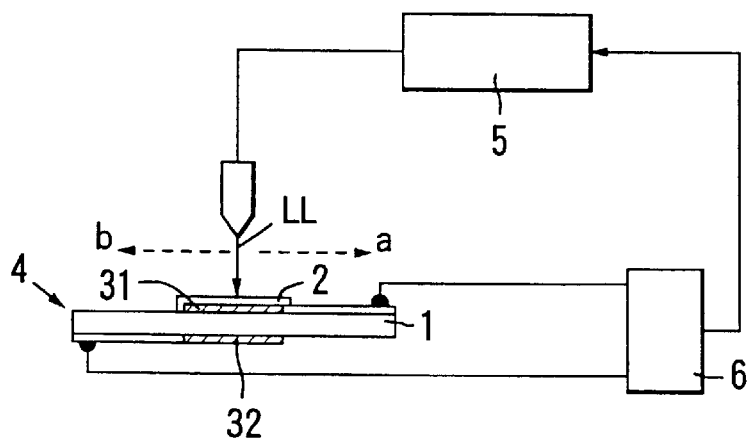
FIG. 17 illustrates a method of the resonance frequency adjustment performed on the piezoelectric component illustrated in FIG. 16.

FIG. 17 illustrates a method for resonance frequency adjustment implemented on the piezoelectric component illustrated in FIG. 16. As shown in the figure, a laser beam LL is radiated onto the surface of the deposit 2 added onto the resonating part 3 of the piezoelectric component 4 and then the laser beam LL is scanned to trim the surface of the deposit 2. The wavelength of the laser beam LL employed for this purpose should be equal to or less than 350 nm. The laser beam LL is generated by the laser apparatus 5. Various types of laser, including an excimer laser, a solid-state laser, a gas laser, an organic laser and the like may be used as the laser apparatus 5. In the embodiment, a solid-state YAG laser was used. When a solid-state YAG laser is used, the requirement that the wavelength of the laser beam LL must be equal to or less than 350 nm is satisfied by using the laser beam at the fourth harmonic, which has a wavelength of 266 nm.

Since, by using a laser beam having a wavelength of 350 nm or less to trim the surface of the deposit 2, the surface of the deposit 2 can be trimmed evenly to achieve a standardized surface roughness $R_0$ of 0.005 or less, a high degree of accuracy for the resonance frequency and a high Q value can be set. It has been confirmed that the Q value becomes lower if the trimming is performed using a laser beam having a wavelength greater than 350 nm, e.g., a laser beam having a wavelength of 353 nm.

During the trimming process, by measuring the resonance frequency of the piezoelectric component and radiating the laser beam LL, which is controlled in correspondence to the degree of deviation in the measured resonance frequency relative to a target resonance frequency, at the deposit 2, the resonance frequency can be easily adjusted to the target resonance frequency. In the embodiment illustrated in FIG. 17, the measuring device 6 which measures resonance frequencies of piezoelectric components is provided so that the data of the resonance frequency obtained at the measuring device 6 are sent to the laser apparatus 5 which, in turn, irradiates the laser beam LL controlled in correspondence to the degree of deviation in the measured resonance frequency relative to the target resonance frequency at the deposit 2. By repeating this adjustment, the adjustment accuracy of the resonance frequency can be raised to a higher level.

Since the wavelength of the laser beam LL, which is radiated onto the deposit 2 is equal to or less than 350 nm, only an extremely small quantity of the laser light LL is converted to heat. Consequently, the resonance frequency of the piezoelectric component can be measured even immediately after irradiation by the laser beam LL. Thus, it is possible to repeat the trimming adjustment employing the laser beam LL without having to allow time intervals.

Figure 18:
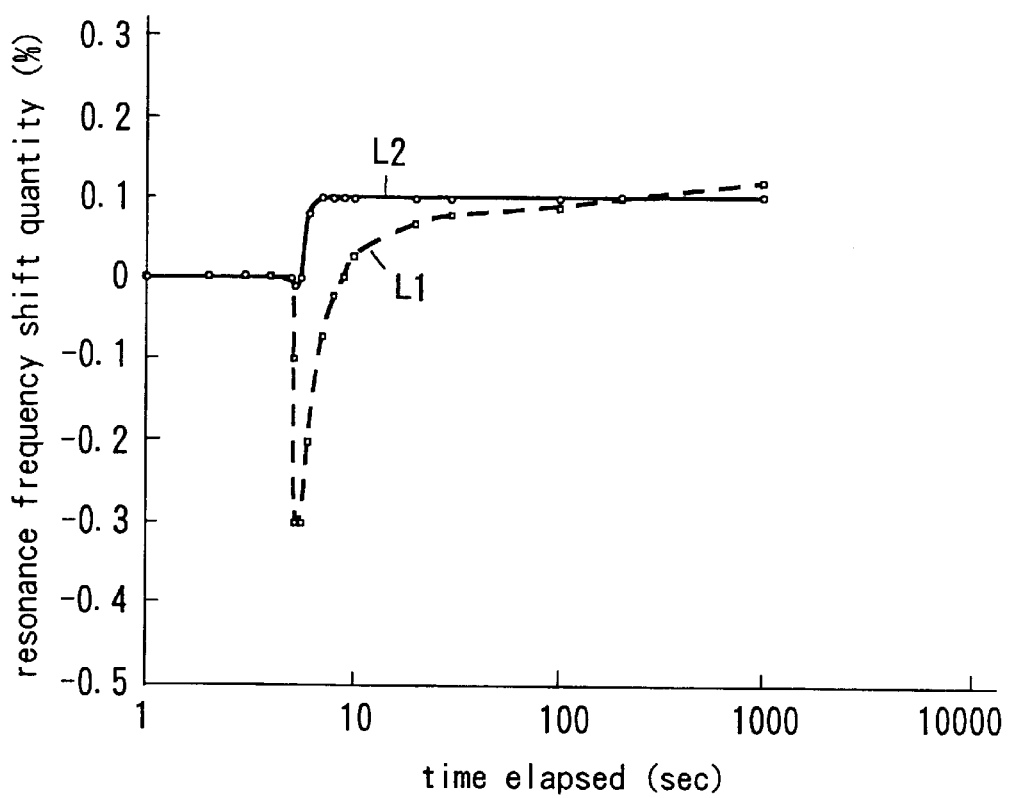
FIG. 18 presents data illustrating the relationship between the length of elapsed time (sec) and the resonance frequency; shift quantity (%)

FIG. 18 presents data that indicate the relationship between the length of elapsed (sec) and the resonance frequency shift quantity (%). The curve L1 represents the characteristics achieved when the fundamental harmonic (wavelength; 1.06 μm) of a solid-state YAG laser is used and the curve L2 represents the characteristics achieved when the fourth harmonic (wavelength; 266 nm) of the solid-state YAG laser is used. As the characteristics curve L2 demonstrates, when the fourth harmonic (wavelength ; 266 nm) having a wavelength equal to or less than 350 nm is used, the oscillation frequency shift quantity immediately after irradiation with the laser beam is small and, furthermore, the fluctuation in the oscillation frequency converges to a constant value within a short length of time. As a result, a series of tasks such as re-measurement and fine adjustment can be implemented promptly without having to allow time intervals. In contrast, if the fundamental harmonic (wavelength ; 1.06 μm) is used, the resonance frequency shift quantity immediately after the laser beam irradiation is large and, furthermore, since the resonance frequency fluctuation lasts a long time, as indicated by the characteristics curve L1, the series of tasks including re-measurement and fine adjustment cannot be implemented promptly.

Figure 19:
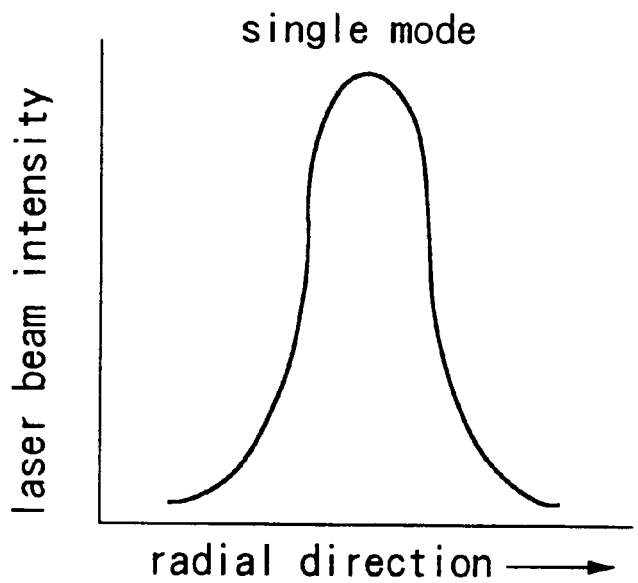
FIG. 19 illustrates the laser intensity characteristics in the direction of the radius of the spot of a single-mode laser beam.
Figure 20:
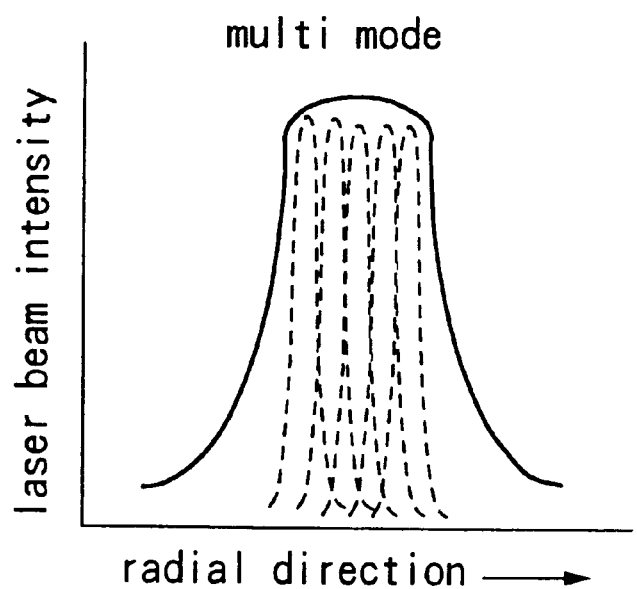
FIG. 20 illustrates the laser intensity characteristics in the direction of the radius of the spot of a multi-mode laser beam.

Either a single-mode or multi-mode laser beam LL may be employed. Of these, a multi-mode laser beam is especially suitable. FIG. 19 illustrates the laser intensity characteristics in the direction of the radius of the spot of a single-mode laser beam, whereas FIG. 20 illustrates the laser intensity characteristics in the direction of the radius of the spot with a multi-mode laser beam. As is obvious from a comparison of FIGS. 19 and 20, the intensity distribution within the spot of the multi-mode laser beam is flatter than that of the single-mode laser beam. As a result, the surface can be trimmed more easily through irradiation of a multi-mode laser beam.

Figure 21:
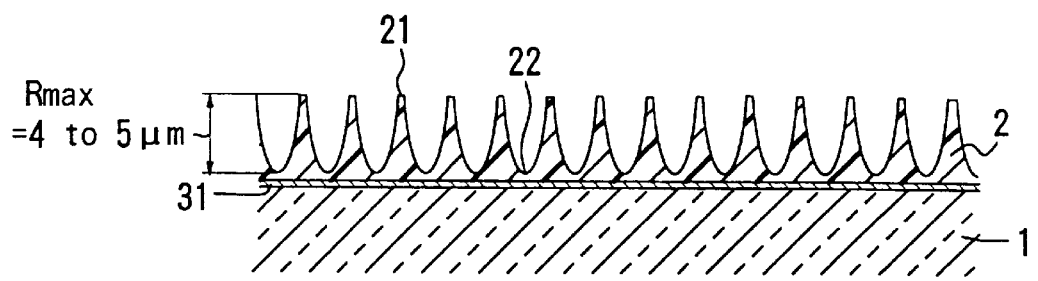
FIG. 21 schematically illustrates the state achieved when the deposit 2 is trimmed by using a single-mode laser beam at the fundamental harmonic (wavelength; 1.06 µm) of a solid-state YAG laser.

As has been explained, the fourth harmonic of a solid-state YAG laser is particularly suited when a multi-mode laser beam is employed. FIG. 21 schematically illustrates a state that is achieved when the deposit 2 is trimmed by using a single-mode laser beam constituted at the fundamental harmonic (wavelength; 1.06 μm) of a solid-state YAG laser. As illustrated in the figure, the surface roughness Rmax achieved through the trimming is relatively large, reaching 4 to 5 μm in the case of the deposit 2 having a thickness of 5 μm. Since a ceramic oscillator achieving a resonance frequency $\lambda_0$ of 40 MHz is to be obtained in the embodiment, Rmax calculated through the conversion formula for the standardized surface roughness described earlier must be 1.0 μm or less, and thus, Rmax reaching 4 to 5 μm greatly deviates from this requirement.

Figure 22:
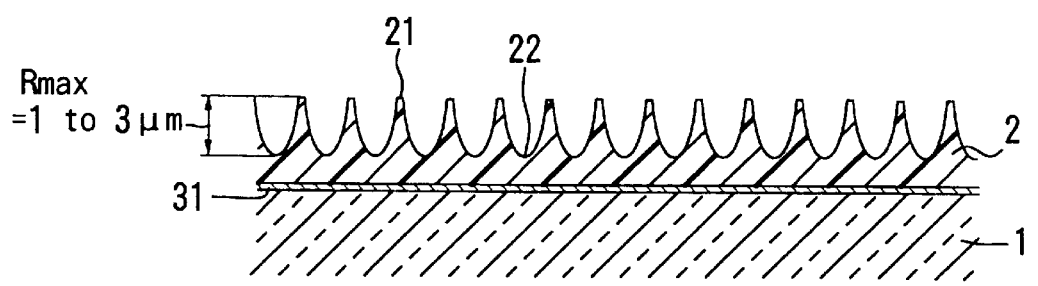
FIG. 22 schematically illustrates the state achieved when the deposit 2 is trimmed by using a single-mode laser beam at the fourth harmonic (wavelength; 266 nm) of a solid-state YAG laser.

FIG. 22 schematically illustrates a state achieved by trimming the deposit 2 using a single-mode laser beam constituted at the fourth harmonic (wavelength; 266 nm) of a solid-state YAG laser. As illustrated in the figure, the surface roughness Rmax achieved through the trimming is smaller than that achieved by employing a single-mode laser beam constituted at the fundamental harmonic. Even so, the surface roughness Rmax is in a range of 1to 3 μm, and there is a difficulty in satisfying the requirement that the surface roughness Rmax must be smaller than 1.0 μm.

Figure 23:
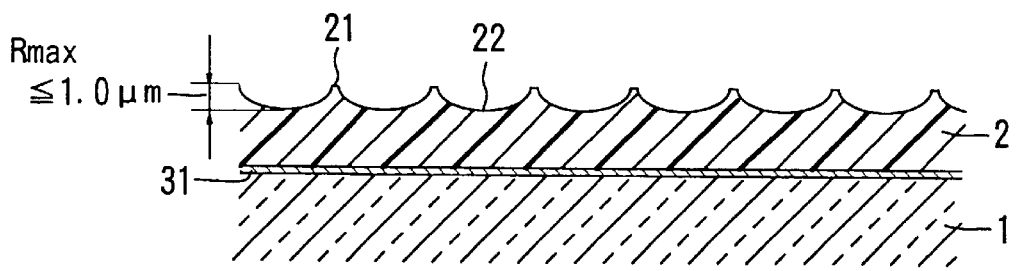
FIG. 23 schematically illustrates the state achieved when the deposit 2 is trimmed by using a multi-mode laser beam at the fourth harmonic (wavelength; 266 nm) of a solid-state YAG laser.

FIG. 23 schematically illustrates a state achieved by trimming the deposit 2 using a multi-mode laser beam at the fourth harmonic (wavelength ; 266 nm) of a solid-state YAG laser. As illustrated in the figure, the surface roughness Rmax can be set at 0.1 μm or smaller.

Furthermore, as explained earlier, since a multi-mode laser beam achieves a flatter intensity distribution within the spot compared to a single-mode laser beam LL, the surface can be trimmed more consistently by irradiating with a multi-mode laser beam LL to ensure that hardly any degradation of the Q value occurs.

Alternatively, trimming may be performed by evenly scanning the spot of the laser beam LL over the entire surface of the deposit. The quantity by which the resonance frequency shifts per scan described above is constant. As a result, the resonance frequency can be adjusted in correspondence to the number of times that a scan is performed with the spot of the laser beam LL.

Next, a test example of the scanning described above and its results are explained. In the test, a solid-state YAG laser was employed to scan a spot of a multi-mode laser beam LL at the fourth harmonic. The test was conducted under the following conditions the laser intensity at the surface of the deposit at 10 mW; the spot diameter at 10 μm; the Q switch frequency at 10 kHz; the scan speed at 1000 mm/sec; and the scan area at 1.0 mm×1.0 mm.

Figure 24:
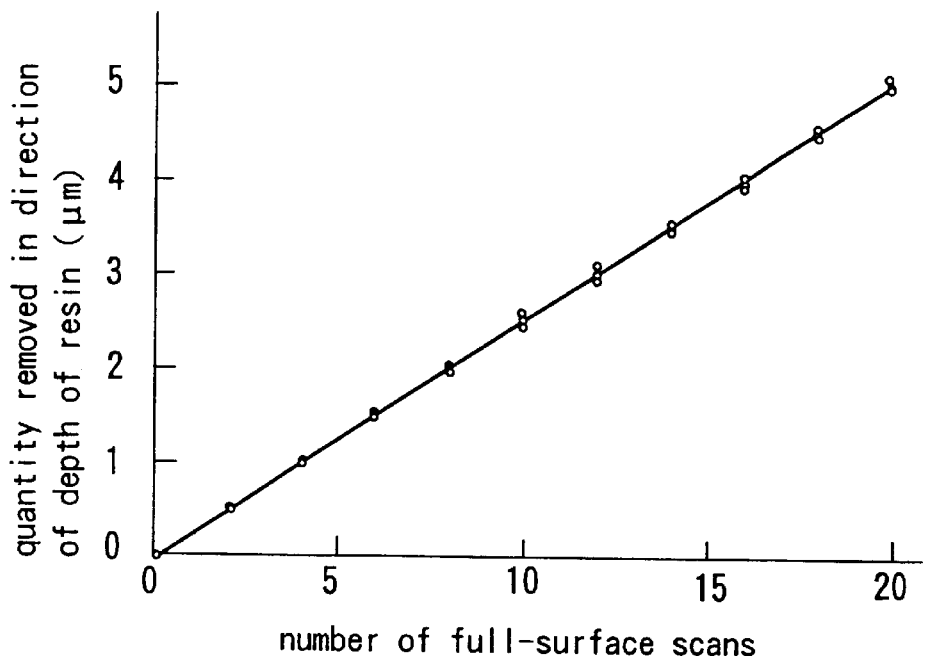
FIG. 24 illustrates the relationship between the number of full-surface scans and the quantity of resin trimmed in the direction of the depth of the resin constituting the deposit.

FIG. 24 illustrates the relationship between the number of full-surface scans and the quantity of resin trimmed in the direction of the depth of the resin constituting the deposit. As the figure indicates, approximately 0.25 μm of the resin is trimmed per full-surface scan. Through this, the resonance frequency is adjusted.

Figure 25:
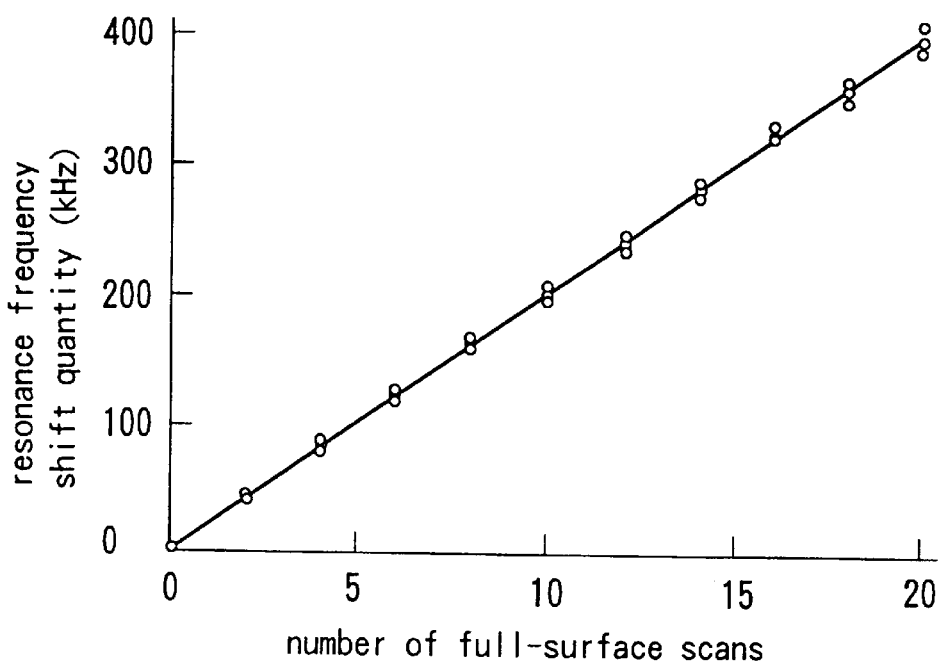
FIG. 25 illustrates the relationship between the number of full-surface scans and the quantity of shift in the resonance frequency (kHz)

FIG. 25 illustrates the relationship between the number of full-surface scans and the quantity of resonance frequency shift (kHz). As indicated in the figure, the resonance frequency shifts by approximately 20 kHz toward the higher frequency side per full-surface scan. Based upon these results, the number of scans to be performed can be determined through the following formula.

number of scans={(target resonance frequency)−(measured resonance frequency)}/20 kHz In addition, a pulse oscillation type laser system may be employed to radiate a pulse laser beam evenly over the entire surface of the deposit instead.

The quantity by which the resonance frequency shifts as a result of one irradiation described above is constant. Consequently, the resonance frequency can be adjusted in correspondence to the number of times the pulse laser beam is radiated in a manner similar to that described earlier.

A test for ascertaining the relationship between the standardized surface roughness $R_0$ and the Q value and its results are now explained. For the testing, a multi-mode laser beam at the fundamental harmonic, a single-mode laser beam at the fourth harmonic and a multi-mode laser beam at the fourth harmonic, of a solid-state YAG laser were used.

One scan was conducted using the multi-mode laser beam at the fundamental harmonic under the following scanning conditions:

spot diameter at 50 μm
Q switch frequency at 15 kHz;
scan speed at 300 mm/sec
laser output at 0.5 W, 0.6 W and 0.7 W.

Ten scans were conducted using the single-mode laser beam at the fourth harmonic under the following scanning conditions:

spot diameter at 10 μm;
oscillation Q switch frequency at 10 kHz
scan speed at 1000 mm/sec;
laser output at 10 mW, 15 mW, 20 mW and 25 mW.

Ten scans were conducted using the multi-mode laser beam at the fourth harmonic under the following scanning conditions:

spot diameter at 10 μm;
oscillation frequency at 10 kHz
scan speed at 1000 mm/sec;
laser output at 10 mW and 25 mW.

Figure 26:
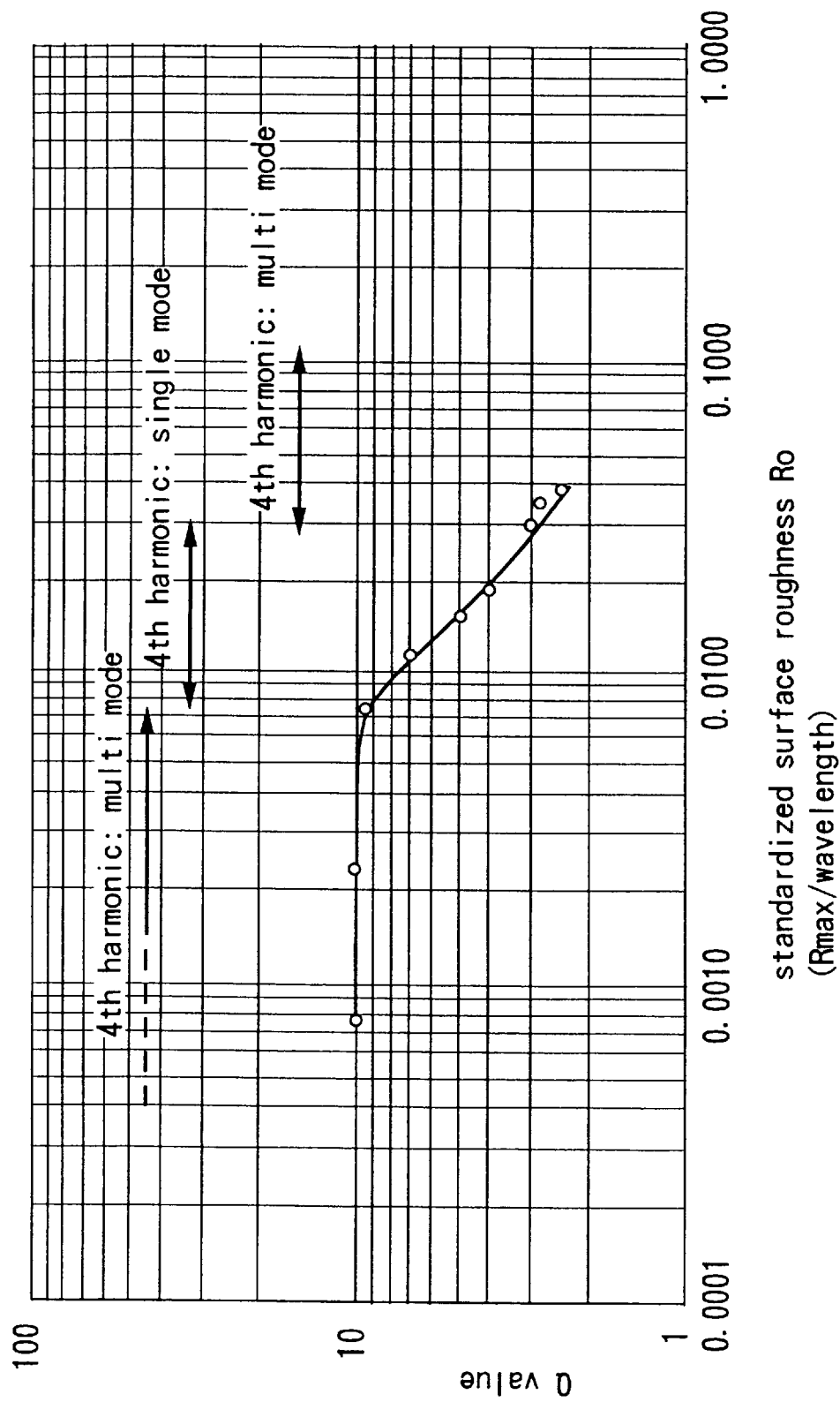
FIG. 26 presents data illustrating the relationship between the standardized surface roughness $R_0$ and the Q value.
Figure 27:
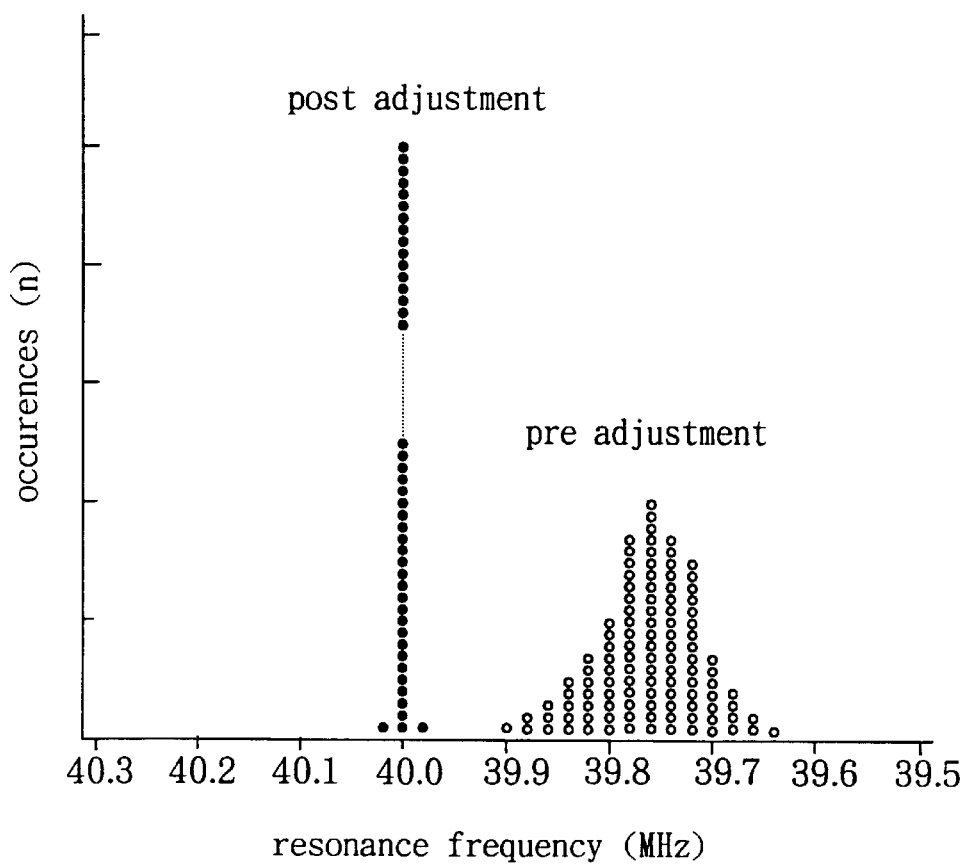
FIG. 27 presents a graph illustrating the distribution of the resonance frequencies.

FIG. 26 presents data indicating the relationship between the standardized surface roughness $R_0$ and the Q value which were obtained through the test described above. It is difficult to satisfy the requirement that the standardized surface roughness $R_0$ be at or less than 0.008 with the multi-mode laser beam at the fundamental harmonic. The requirement that the standard surface roughness $R_0$ be at or less than 0.008 is still not fully satisfied by using the single-mode laser beam at the fourth harmonic. However, with the multi-mode laser beam at the fourth harmonic, the requirement that the standardized surface roughness $R_0$ be at or less that 0.008 is fully satisfied.

Furthermore, according to the present invention, the individual resonance frequencies of a great number of piezoelectric components that tend to deviate greatly can be adjusted to a constant target resonance frequency with a high degree of accuracy.

Next, an example of testing to substantiate the forgoing and its results are explained. In the test, a great number of the piezoelectric components, one of which is illustrated in FIG. 16, were prepared and their resonance frequencies were adjusted to 40.0 MHz by irradiating with a multi-mode laser beam LL at the fourth harmonic using a solid-state YAG laser. The test was conducted under the following conditions:

spot diameter at 10 µm;

oscillation frequency at 10 kHz scan speed at 100 mm/sec.

The number of scans to be performed was determined by using the following formula.

number of scans={(40,000 kHz)−(measured resonance frequency)}/25 kHz

Note that the number of scans to be performed was calculated as an integer value with the numerals after the decimal point rounded off. FIG. 17 is a graph illustrating the frequency distribution of the resonance frequencies. As the figure indicates, the resonance frequencies of the piezoelectric oscillator parts were inconsistent, ranging from 39.6 MHz to 39.9 MHz in the pre-adjustment measurement. The measurement performed after the adjustment demonstrates that the resonance frequencies of almost all the piezoelectric components were consistent at 40.0 MHz.

While the resonance frequencies of piezoelectric components using a thicknesswise longitudinal vibration mode are adjusted, resonance frequencies of piezoelectric components employing a thicknesswise slip vibration mode can be adjusted in a similar manner.

What is claimed is:

1. A method for manufacturing a piezoelectric component that includes a piezoelectric substrate having at least one resonating part, comprising the steps of:

adding a deposit of a resin containing a carbon filler at 0.1 to 20 wt % on a surface of the resonating part;

generating laser beam radiation having a wavelength within a range of 350 to 2000 nm; and controlling the laser beam radiation to impinge on a front surface of said deposit and trim away portions of said deposit to form indented portions to adjust a resonance frequency of said piezoelectric component without any degradation in piezoelectric component characteristics due to laser beam radiation heating.

2. The manufacturing method of claim 1 wherein said step for controlling the laser beam radiation includes measuring said resonance frequency and controlling the laser beam radiation in correspondence to a degree of deviation of said resonance frequency being measured relative to a target resonance frequency.

3. The manufacturing method of claim 1 wherein said generating step includes generating the laser beam radiation from a solid-state YAG laser.

4. The manufacturing method of claim 3 wherein said generating step includes generating the laser beam radiation from the solid-state YAG laser as a beam of radiation having a wavelength selected from the group consisting of a fundamental harmonic, a second harmonic or a third harmonic.

5. The manufacturing method of claim 1 wherein said resonance frequency is adjusted by varying the mass of said deposit through formation of said indented portions.

* * * * *